United States Patent [19]

Montague et al.

[11] Patent Number: 5,798,283
[45] Date of Patent: Aug. 25, 1998

[54] METHOD FOR INTEGRATING MICROELECTROMECHANICAL DEVICES WITH ELECTRONIC CIRCUITRY

[75] Inventors: Stephen Montague; James H. Smith; Jeffry J. Sniegowski; Paul J. McWhorter, all of Albuquerque, N. Mex.

[73] Assignee: Sandia Corporation, Albuquerque, N. Mex.

[21] Appl. No.: 524,700

[22] Filed: Sep. 6, 1995

[51] Int. Cl.$^6$ .................................................. H01L 21/00
[52] U.S. Cl. .................................. 438/24; 438/50; 438/52; 438/200; 438/691
[58] Field of Search .......................... 437/60, 901, 921, 437/927, 974, 228 H, 228 O, 228 SEN; 148/DIG. 73, DIG. 135

[56] References Cited

U.S. PATENT DOCUMENTS

| | | | |
|---|---|---|---|
| 4,562,092 | 12/1985 | Wiech, Jr. | 437/918 |
| 4,859,629 | 8/1989 | Reardon et al. | 437/974 |
| 5,095,401 | 3/1992 | Zavracky et al. | 437/51 |
| 5,242,839 | 9/1993 | Oh et al. | 437/29 |
| 5,260,596 | 11/1993 | Dunn et al. | 257/414 |
| 5,314,572 | 5/1994 | Core | 156/643 |
| 5,326,726 | 7/1994 | Tsang | 437/228 |
| 5,345,824 | 9/1994 | Sherman | 73/517 B |
| 5,399,415 | 3/1995 | Chen | 428/209 |
| 5,412,265 | 5/1995 | Sickafus | 310/40 MM |
| 5,417,111 | 5/1995 | Sherman | 73/517 R |
| 5,427,975 | 6/1995 | Sparks | 437/79 |
| 5,431,051 | 7/1995 | Biebl | 73/517 B |
| 5,431,057 | 7/1995 | Zimmer | 73/724 |
| 5,455,203 | 10/1995 | Koseki et al. | 437/901 |
| 5,504,026 | 4/1996 | Kung | 437/51 |
| 5,550,090 | 8/1996 | Ristic et al. | 437/228 |

FOREIGN PATENT DOCUMENTS 04357854  12/1992  Japan.

OTHER PUBLICATIONS

W. Yun, *CMOS Metallization for Integrateion with Micromachining Processes*, Thesis for Master of Science Degree in Electrical Engineering from the University of California, Berkley, May 19, 1989.

W. Riethmuller, W. Benecke, U. Schnakenberg, and B. Wagner, "A Smart Accererometer with On-Chip Electronics Fabricated by a Commercial CMOS Process," *Sensors and Actuators A*, vol. 31 pp. 121–124, 1992.

W. Kuehnel and S. Sherman, "A Surface Micromachined Silicon Accelerometer with On-Chip Detection Circuitry," *Sensors and Actuators A*, vol. 45, pp. 7–16, 1994.

R. T. Howe, "Polysilicon Integrated Microsystems: Technologies and Applications," *Digest of Technical Papers for the 8th International Conference on Solid–State Sensors and Actuators and Eurosensors IX*, Stockholm, Sweden, Jun. 25–29, 1995, vol. 1, pp. 43–46.

*Primary Examiner*—Michael Trinh
*Attorney, Agent, or Firm*—John P. Hohimer

[57] ABSTRACT

A method for integrating one or more microelectromechanical (MEM) devices with electronic circuitry. The method comprises the steps of forming each MEM device within a cavity below a device surface of the substrate; encapsulating the MEM device prior to forming electronic circuitry on the substrate; and releasing the MEM device for operation after fabrication of the electronic circuitry. Planarization of the encapsulated MEM device prior to formation of the electronic circuitry allows the use of standard processing steps for fabrication of the electronic circuitry.

34 Claims, 13 Drawing Sheets

5,798,283

METHOD FOR INTEGRATING MICROELECTROMECHANICAL DEVICES WITH ELECTRONIC CIRCUITRY

This invention was made with Government support under Contract No. DE-AC04-94AL85000 awarded by the U.S. Department of Energy. The Government has certain rights in the invention.

FIELD OF THE INVENTION

The present invention relates to methods for fabricating microelectromechanical devices. More particularly, the invention is directed to a novel fabrication technology whereby microelectromechanical devices may be integrated with electronic circuitry on the same substrate or chip.

BACKGROUND OF THE INVENTION

Microelectromechanical (MEM) devices have applications for forming many and varied types of microsensors and microactuators. The monolithic integration of MEM devices with electronic circuitry offers the possibility for increasing performance (e.g. forming "smart sensors" having driving, control, and signal processing circuitry formed therewith on a substrate or chip) and reliability as well as significantly reducing size and cost. Furthermore, the sensitivity of many types of microsensors (e.g. accelerometers) may be improved by a reduced noise level provided by on-chip circuitry.

U.S. Pat. No. 5,326,726 to Tsang et al discloses an interleaved or merged process approach for fabricating a monolithic chip containing integrated circuitry interconnected to a microstructure (i.e. a MEM device). The approach of Tsang et al requires that the separate steps for forming the MEM device and the integrated circuit be interleaved for compatibility, with the electronic circuitry being formed at least in part prior to the MEM device, and electrical interconnections between the circuitry and the MEM device being formed thereafter. While Tsang et al use some essentially standard process steps, other process steps must be modified due to conflicting requirements between the circuitry and MEM devices.

These modified process steps are primarily dictated by thermal cycles and topography during processing which are largely responsible for determining a strategy for developing a merged or interleaved approach for integrating MEM devices with electronic circuitry. As an example, "islands" of severe topography may be formed by MEM devices extending upward several microns above the substrate, requiring modifications to photolithography and etching processes for forming electrical interconnections between the MEM devices and circuitry. Such modification of process steps to the extent that it deviates from standard processing steps is disadvantageous and costly in requiring that the modified process steps be adapted to a particular type of MEM device, and altered for fabrication of other types of MEM devices. The development of non-standard process steps for forming electronic circuitry that are dictated by requirements of a particular MEM device is disadvantageous in requiring a lengthy period of time for process modification or re-engineering, thereby preventing rapid prototyping of different MEM technologies or MEM development work. Furthermore, since process steps for forming electronic circuitry (e.g. CMOS) are well established and standardized, any modification of the process steps may significantly decrease the circuit performance and the overall process yield.

What is needed is a method for integrating MEM devices with electronic circuitry that substantially separates the process steps for fabricating the MEM devices from the process steps for fabricating the electronic circuitry, thereby allowing the use of standard process steps as known to the art, especially for the electronic circuitry.

Heretofore, such a separation of steps for fabricating MEM devices and steps for fabricating electronic circuitry has been based on a method of fabricating the electronic circuitry prior to fabrication of the MEM devices in a circuitry-first approach. This approach has been primarily motivated by concerns about contamination and a rough topography that is generally thought to be inevitable if the MEM devices were fabricated first. A rough topography places severe demands on subsequent lithography and etching processes for forming the electronic circuitry. The use of a circuitry-first approach, however, is disadvantageous in requiring deviations from standard processing steps (i.e. process modifications), especially in requiring the use of tungsten instead of aluminum for the interconnect metallization to withstand a high-temperature annealing step required to at least partially relieve stress in polysilicon elements (e.g. cantilevered beams) of MEM devices. However, the use of tungsten as an interconnect metallization is not altogether satisfactory, resulting in additional problems including a high contact resistance and hillock formation that can lead to failure of a nitride layer protecting the circuitry during release of the MEM devices. Additional problems known to occur with this prior-art circuitry-first approach include an undesirable formation of tungsten silicides, and poor adhesion of the tungsten interconnect metallization.

An advantage of the method of the present invention is that microelectromechanical (MEM) devices may be integrated with electronic circuitry on a substrate while using standard process steps with little if any modification for fabricating the electronic circuitry, including the use of an aluminum interconnect metallization in preferred embodiments of the present invention.

Another advantage of the present invention is that one or more MEM devices may be fabricated prior to fabrication of electronic circuitry, with the MEM devices being encapsulated to prevent contamination of a device surface of the substrate.

A further advantage of the present invention is that the substrate may be planarized prior to formation of the electronic circuitry thereby providing a substantially smooth and planar surface topography for subsequent process steps for fabricating the electronic circuitry.

Still another advantage of the present invention is that the encapsulated MEM devices may be annealed under temperature and time conditions sufficient to relieve strain in elements of the MEM devices prior to formation of the electronic circuitry including the interconnect metallization.

Yet another advantage is that by providing one or more encapsulated MEM devices formed within a cavity below a device surface of a planarized substrate, the substrate may be handled and processed thereafter using substantially standard process steps with little if any modification for forming the electronic circuitry (including the interconnect metallization).

Another advantage of the method of the present invention is that packaging of both MEM and integrated devices (i.e. MEM devices integrated with electronic circuitry) may be simplified and cost reduced by forming one or more of the MEM devices below a device surface of a substrate with an overlying layer forming at least a part of an enclosure for packaging the devices.

These and other advantages of the method for integrating microelectromechanical devices with electronic circuitry of the present invention will become evident to those skilled in the art.

SUMMARY OF THE INVENTION

Accordingly, it is a primary object of the present invention to provide a method for integrating microelectromechanical devices with electronic circuitry that provides for fabrication of the electronic circuitry by standard process steps as known to the art (with little if any modification) after fabrication and encapsulation of one or more MEM devices on a substrate.

An additional object of the present invention is to provide a method that forms the MEM devices within a protected enclosure thereby simplifying packaging and reducing the cost for packaging the MEM devices with or without integrated electronic circuitry.

A further object of the present invention is to provide a method for integrating microelectromechanical devices with electronic circuitry that allows the use of an aluminum interconnect metallization.

Still another object of the present invention is to provide a method for forming microelectromechanical devices encapsulated within a substrate having a planarized device surface so that electronic circuitry may be fabricated on the substrate by a separate set of standard process steps performed by a separate entity (e.g. an integrated circuit foundry) using standard processes as known to the art.

An additional object of the present invention is to provide a method for integrating microelectromechanical devices with electronic circuitry that minimizes any need for modifications to standard process steps for forming the electronic circuitry.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a method is provided for integrating microelectromechanical (MEM) devices with electronic circuitry that comprises the steps of forming one or more MEM devices below a device surface of a substrate; encapsulating the MEM devices and planarizing the substrate prior to forming electronic circuitry thereon; and releasing the MEM devices for movement or operation thereof after fabrication of the electronic circuitry.

Other objects, advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The fabrication method of the present invention combines processes for fabricating one or more microelectromechanical (MEM) devices with processes for fabricating electronic circuitry (e.g. CMOS, BiCMOS, bipolar, or the like) in a mutually compatible manner. The integration of the MEM devices with electronic circuitry provides added functionality for driving and control of microactuators (i.e. MEM devices providing some form of actuation, including linear and rotary motors, gears, levers, linkages and the like) and provides a means for amplifying and/or processing (including compensation, linearization, and control) of sensory signals generated by microsensors (i.e. MEM devices responding to some form of external applied stimuli, including accelerometers, pressure sensors, flow sensors, chemical sensors, optical sensors, resonant oscillators and the like). Such integration provides advantages in terms of increased functionality and sensitivity, and reduced size and cost as compared to MEM devices being formed on a separate chip from the electronic circuitry.

Figure 1:
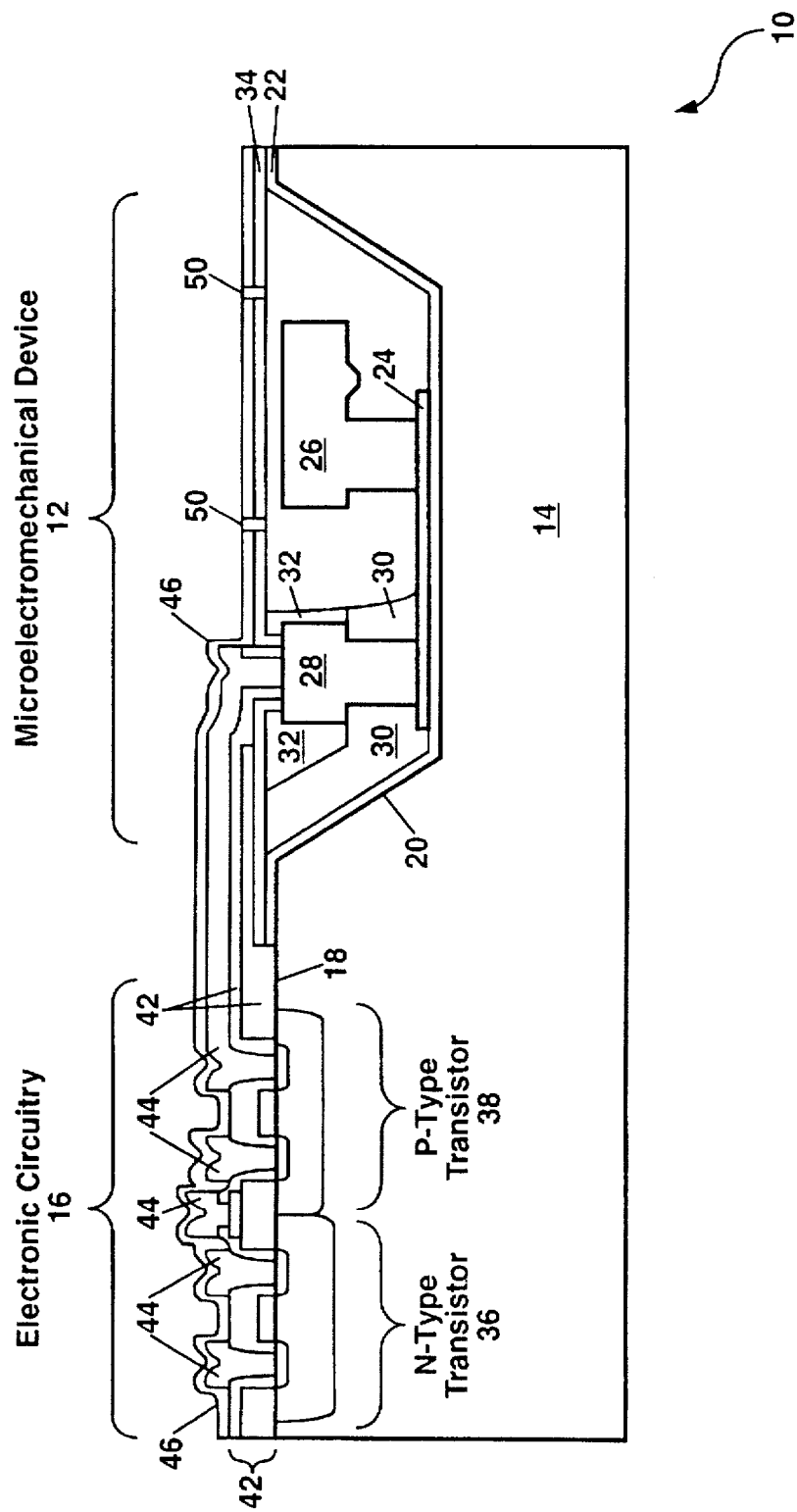
FIG. 1 shows a schematic cross-sectional representation of an integrated device 10 having one or more MEM devices integrated with electronic circuitry according to the method of the present invention.

Referring to FIG. 1, there is shown a schematic cross-section representation of an integrated device 10 comprising one or more microelectromechanical devices 12 formed on a common substrate 14 and electrically connected to electronic circuitry 16 on the substrate. The process steps for forming such an integrated device 10 are shown in FIGS. 2–13 and described hereinafter.

Figure 2:
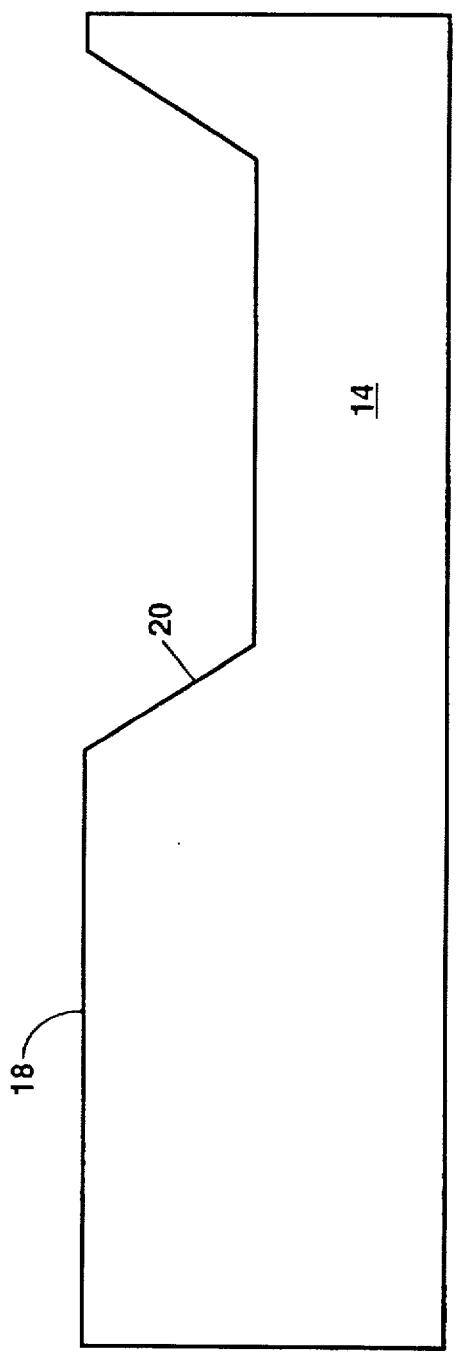
FIGS. 2–13 show schematic cross-section representations of the integrated device of FIG. 1 during various process steps for forming the integrated device.

In FIG. 2, a substrate 14 is provided for formation of the integrated device 10. The substrate 14 represents a portion of a monocrystalline silicon wafer which is made sufficiently thick so as to permit handling, while the lateral dimensions of the wafer are generally large enough such that the wafer may be subsequently diced into a number of chips each containing an integrated device 10. The substrate may be undoped or n- or p-type doped depending on a predetermined set of standard processes (and including design rules) to be used for forming the electronic circuitry 16. As an example, an n-type substrate 14 may be preferred for forming electronic circuitry by one set of standard CMOS process steps having 2-μm design rules; whereas for circuitry formed by another set of standard CMOS processing steps having 0.5-μm design rules, a p-type substrate may be preferred. The substrate 14 may further include one or more epitaxial semiconductor layers formed thereon (including doped layers) with a total layer thickness of about 2–10 μm or more for providing a smooth low-defect-density device surface 18 for formation of the electronic circuitry. (A buried doped epitaxial layer may be provided for forming BiCMOS or bipolar circuitry.)

In FIG. 2, one or more open cavities 20 are etched into the device surface 18 of the substrate at predetermined locations wherein one or more MEM devices 12 are to be fabricated. The dimensional characteristics each cavity 20 including its length, width and depth, can vary depending on the geometric configuration of a particular type of MEM device to be formed by practice of the present invention. In general, however, the portion of the substrate 14 containing the MEM devices is small in comparison to the remaining portion containing the electronic circuitry and bonding or contact pads.

Each cavity 20 is preferably formed by a bulk micromachining process after providing a patterned first masking layer (e.g. about 500 nanometers of a silicate glass deposited from the decomposition of tetraethylortho silicate, also termed TEOS, that has been densified by heating to a high temperature for a specified period of time) covering the device surface 18 with openings at the locations of each cavity to be formed. Each cavity 20 is then etched into the substrate using wet and/or dry etch processes as known to the art. A preferred etching process uses an anisotropic etchant such as potassium hydroxide (KOH), tetramethyl ammonium hydroxide (TMAH) or ethylenediamine pyrocatechol (EDP) to form one or more cavities 20 that may be, for example, about 2–20 µm or more deep with a substantially planar bottom surface and sloping inner sidewalls formed by selective etching along preferred (111) crystallographic planes as shown in FIG. 2. The use of an anisotropic etchant may be advantageous for providing improved optical access to the bottom surface of each cavity thereby providing an increased latitude for subsequent photolithography steps for forming elements of the MEM structure within each cavity (including providing alignment marks on the bottom surface of the cavity). After formation of one or more cavities on the substrate, the patterned first masking layer is removed (e.g. with a 6:1 buffered oxide etchant comprising HF).

Figure 3:
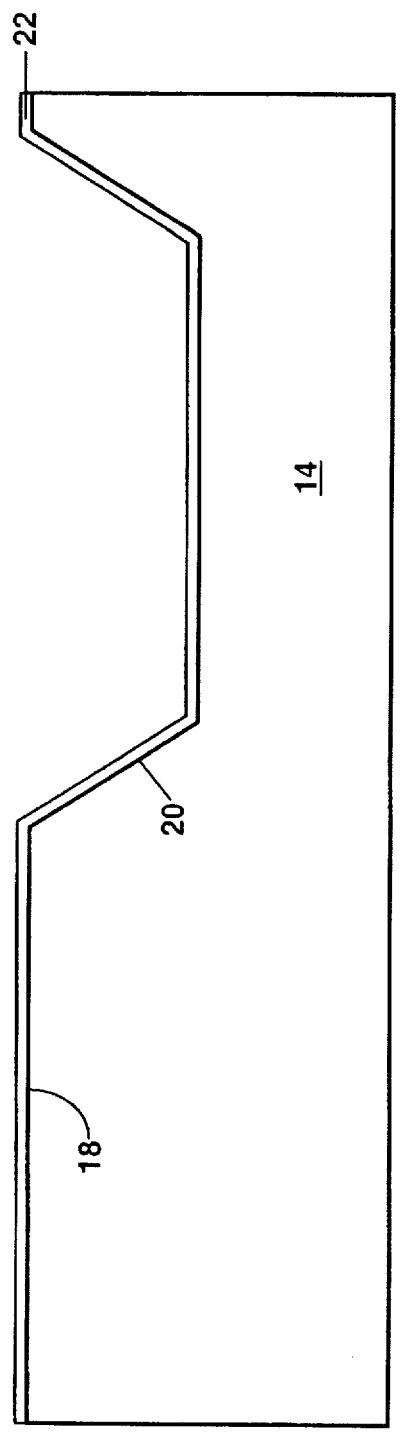

In FIG. 3, a first nitride layer 22 (i.e. silicon nitride) is deposited to blanket the device surface 18 and each cavity 20 after first forming a thin blanket layer of a thermal oxide (approximately 60 nanometers of silicon dioxide formed by a thermal diffusion process) to protect the bare silicon from exposure to the first nitride layer 22. The first nitride layer 22 is up to about 200–300 nanometers thick, and is preferably formed by a low-pressure chemical vapor deposition (CVD) process that produces low residual stress in the nitride layer 22. The portion of the first nitride layer 22 above the device surface 18 will later be used as a stop for a chemical-mechanical polishing process for planarizing a top side of the substrate; and the remainder of the first nitride layer covering the inner surfaces of each cavity 20 will serve as a dielectric isolation layer, and also as an etch stop during process steps for patterning a first sacrificial layer 30 and for later releasing the MEM devices by etching sacrificial layers within the cavity (e.g. the layers 30 and 32).

Figure 4:
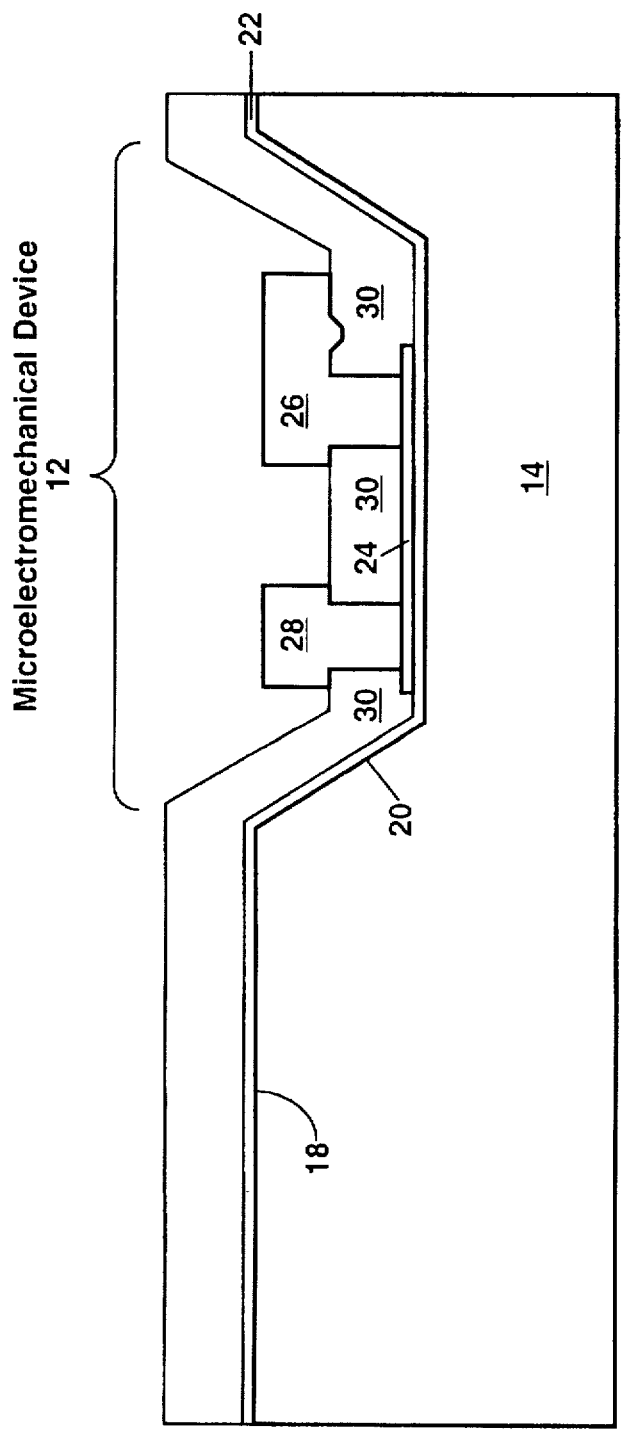

In FIG. 4, one or more MEM devices 12 are formed within each cavity 20, with the MEM devices preferably being located entirely below the device surface 18 of the substrate 14. Formation of the MEM devices may include surface and bulk micromachining processes as known to the art. In surface micromachining processes, for example, one or more thin films (up to a few microns thick) of micromachineable materials such as polycrystalline silicon (also termed polysilicon), silicon nitride (also termed nitride), silicon dioxide (also termed oxide), metals (e.g. tungsten, gold, copper, platinum, nickel, palladium), metal alloys (including metal silicides) and the like may be deposited within the cavity through patterned masking layers and anisotropically etched to form the MEM devices, especially MEM devices requiring small feature sizes (e.g. minimum widths of elements and/or gaps between elements of about 1–2 µm). One or more sacrificial layers comprising a sacrificial material such as silicon dioxide or one or more silicate glasses as may be deposited by a CVD process. After formation of the electronic circuitry, the sacrificial material may be removed at least in part from each cavity 20 for releasing the MEM devices for movement or operation. Bulk micromachining processes including LIGA (a German acronym taken from words referring to lithography, electroplating and injection molding) may be used to form MEM devices having larger vertical dimensions (up to 300 µm or more) with minimum feature sizes down to about 2 µm.

FIG. 4 shows an example of a MEM device 12 comprising a first-deposited polysilicon layer 24 that is preferably doped (e.g. by an ion implantation and/or thermal diffusion step) and patterned for forming a voltage reference plane and for providing electrical interconnections between elements of the MEM device. In FIG. 4, additional polysilicon layers may be deposited and patterned by any conventional method to form one or more fixed support beams 26, moveable support beams (not shown), electrical interconnection studs 28, or the like having predetermined forms or shapes depending on a particular MEM device 12 to be fabricated. A single additional polysilicon layer may be provided above the first polysilicon layer 24 when simple MEM devices such as accelerometers based on capacitively-coupled cantilevered beams are to be formed according to the present invention.

For more complex MEM devices, however, further polysilicon layers are generally required. For example, a preferred process for forming complex, interconnected, interactive, microactuated MEM devices 12 having springs, linkages, mass elements, joints and the like generally requires the deposition and patterning of three additional layers of polysilicon above the first polysilicon layer 24, with each of the polysilicon layers being separated by a sacrificial layer (e.g. a thin oxide or silicate glass layer) and/or by a friction-reduction nitride layer (e.g. for forming bearing surfaces for moveable elements such as gears, rotors, levers, linkages etc.). This preferred three-layer process is advantageous for mechanically interconnecting elements of a MEM device 12 by hard linkages for actuation, or for coupling mechanical energy via micromachined gears, levers, linkages or the like. Furthermore, since each polysilicon layer may be selectively doped for use as an electrical conductor, this preferred three-layer process provides additional flexibility for electrical interconnections and/or electrodes. The additional polysilicon layers may be deposited, at least in part, through one or more patterned sacrificial layers 30 for defining a shape of the MEM elements, and for forming anchor portions for mechanical and electrical connection to the first-deposited polysilicon layer 24.

Figure 5:
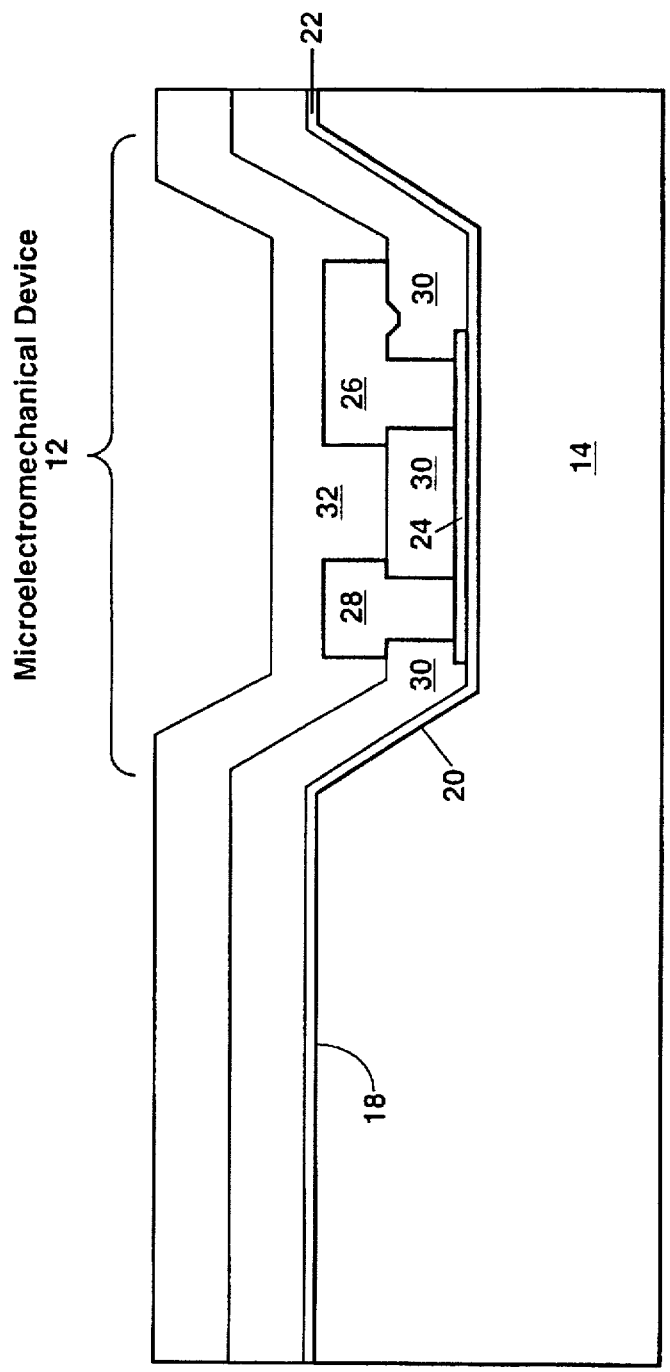

In FIG. 5, after formation of the MEM devices 12 (with the polysilicon layers being formed into their final shapes to define elements of the MEM devices), one or more additional sacrificial layers 32 (comprising the same or different sacrificial materials such as silicon dioxide or silicate glasses that may be later removed by selective etching) may be deposited to completely bury or encapsulate the MEM devices for protection and planarization of each cavity 20 during formation of the electronic circuitry 16. The sacrificial layers 30 and 32 may be grown or deposited in a completely conventional manner (e.g. by CVD wherein an oxide or silicate glass layer-forming gas is decomposed to form the layers 30; or by plasma-enhanced CVD, also termed PECVD, wherein applied rf power is provided to assist the decomposition for deposition at a low temperature of about 600° C. or less), with each layer thickness being tailored to particular requirements of the MEM devices to be formed.

Figure 6:
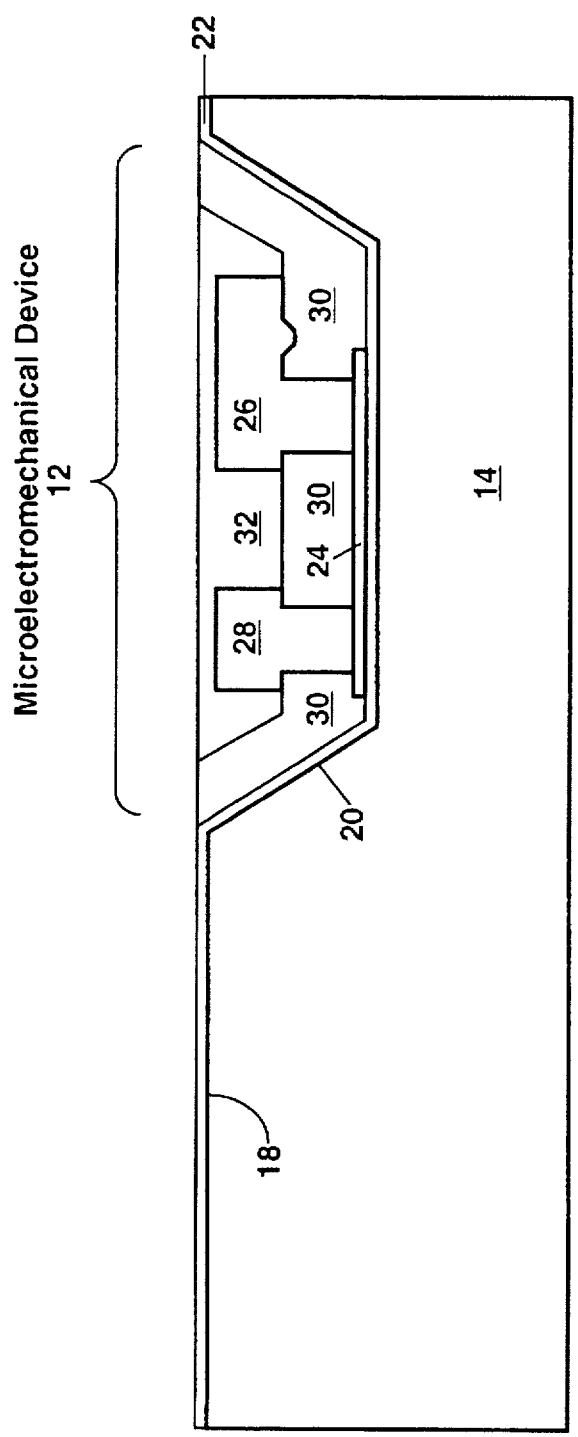
Figure 7:
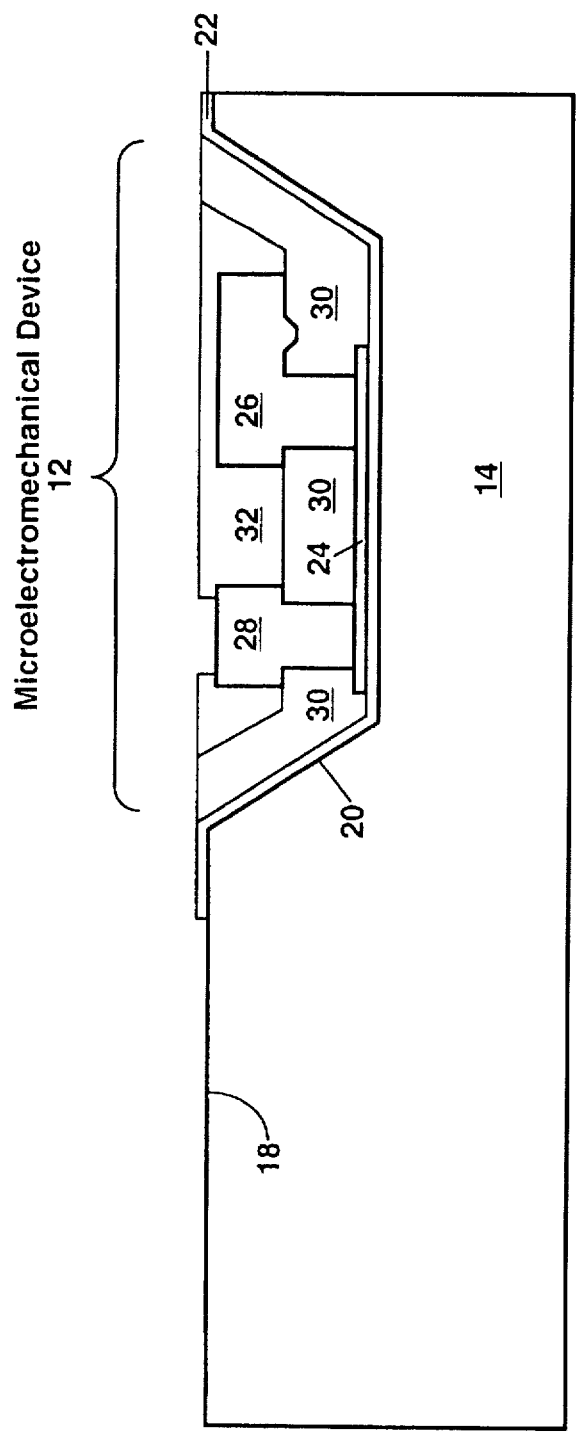

The additional sacrificial layers 32 are preferably deposited so as to extend upward beyond the device surface 18 and most preferably beyond the nitride layer 22 as shown in FIG. 5, thereby allowing a step for planarizing the substrate. In FIG. 6, the substrate planarization step is preferably performed by chemical-mechanical polishing of a top side of the substrate as known to the art. To reduce the time required for chemical-mechanical polishing of the substrate, it may be preferable to mask a region above the cavity 20 with a resist or the like and to remove the unmasked portions of the sacrificial layers 30 and 32 by a dry etching step. During the substrate planarization step, the first nitride layer 22 is preferably used as a stop to limit a downward extent of the chemical-mechanical polishing, thereby providing a substantially planar upper surface for the substrate. After the chemical-mechanical polishing step, the nitride layer 22 in acting as a stop may be reduced to about 100–300 nanometers thickness.

After planarization of the substrate, a second nitride layer (i.e. a cap layer) 34 may be deposited over the planar upper surface of the substrate covering the remaining portion of the first nitride layer 22 and any exposed portions of the sacrificial layers 30 and 32, thereby forming a nitride-to-nitride seal for sealing the encapsulated MEM devices. After this sealing step has been performed, the electronic circuitry 16 may be fabricated according to conventional methods (i.e. standard process steps with little if any modification thereof as known to the art for forming CMOS, BiCMOS, or bipolar circuitry). The sealed substrate may even be shipped to a foundry or other entity for fabrication of the electronic circuitry by a set of standard process steps.

Since any stress within elements of the MEM devices (e.g. polysilicon cantilevered beams) may be detrimental to operation of the device, an annealing step for relieving the stress is preferably performed. This annealing step may be performed before fabrication of the electronic circuitry by heating the substrate and encapsulated MEM devices to a preselected temperature in the range of about 700°–1300° C. for a time period of up to about three hours or more depending upon the level of stress to be relieved. Alternately, the annealing step may be performed during a thermal cycle used for fabricating the electronic circuitry (e.g one or more thermal diffusion steps for forming transistors).

In some cases, the formation of the electronic circuitry 16 may begin immediately after planarizing the substrate, with the second nitride layer 34 being deposited during a standard process step for forming the electronic circuitry. In this case shown schematically in FIG. 7 and described hereinafter with reference to a preferred process for forming CMOS circuitry 16, the first nitride layer 22 and the underlying thermal oxide are preferably removed by etching in the portion of the substrate reserved for formation of the electronic circuitry so that new thermal oxide and nitride layers may be formed with precise thicknesses as required for carrying out a set of standard processes as known to the art for forming the circuitry. For certain interconnect metallization schemes, this process of removing the first nitride layer 22 and the underlying oxide and forming new thermal oxide and nitride layers is preferable for reducing or eliminating metallization step coverage problems. (During these standard process steps, openings may also be made to each polysilicon stud 28 for later use in forming electrical interconnections between the electronic circuitry and the MEM devices.)

Figure 8:
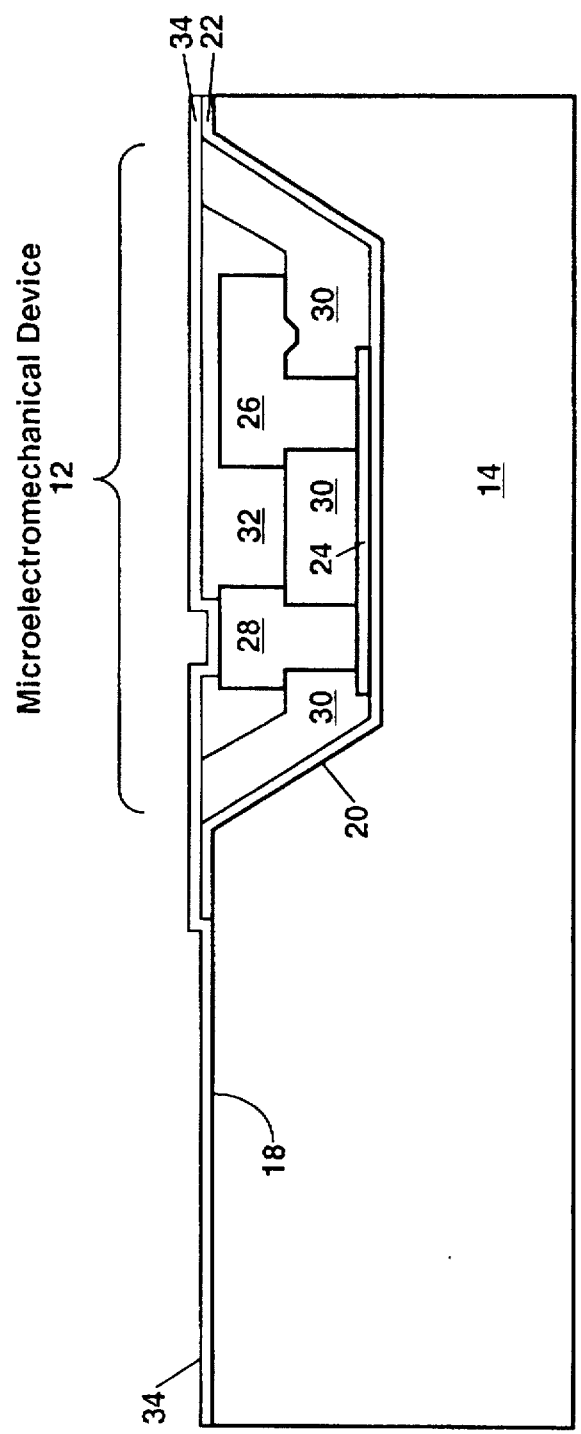
Figure 9:
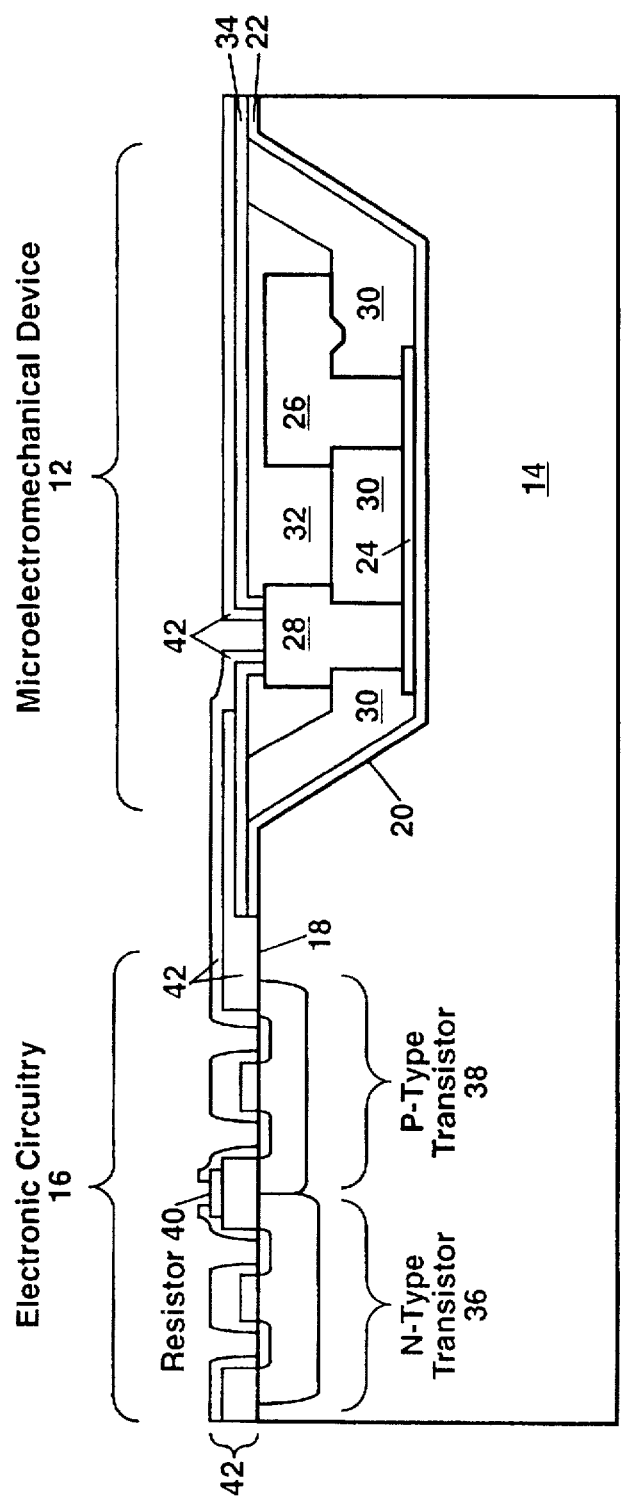

In FIG. 8, after formation of a new thermal oxide layer (about 30–40 nanometers) on the exposed device surface 18, a second nitride layer (i.e. a cap layer) 34 (about 120 nanometers thick) is then deposited over the entire upper surface of the wafer for use in forming CMOS circuitry while simultaneously sealing the encapsulated MEM devices 12. In FIG. 9, openings may be formed through the second nitride layer 34 for forming n-type and p-type isolation wells (also termed tubs) by ion implantation and thermal diffusion steps. Subsequent standard CMOS process steps may be used for forming n-type transistors 36 within the p-type wells and p-type transistors 38 within the n-type wells. Such standard CMOS process steps may include the deposition and patterning of one or more polysilicon layers for forming transistor gates and resistors 40; and the deposition and patterning of a plurality of passivation layers 42 (including, for example, a field oxide layer of CVD silicon dioxide and overlying layers of one or more silicate glasses such as TEOS; phosphorous silicate glass, also termed PSG; borophosphorous silicate glass, also termed BPSG or the like deposited by CVD, PECVD or by any another deposition method as known to the art).

Figure 10:
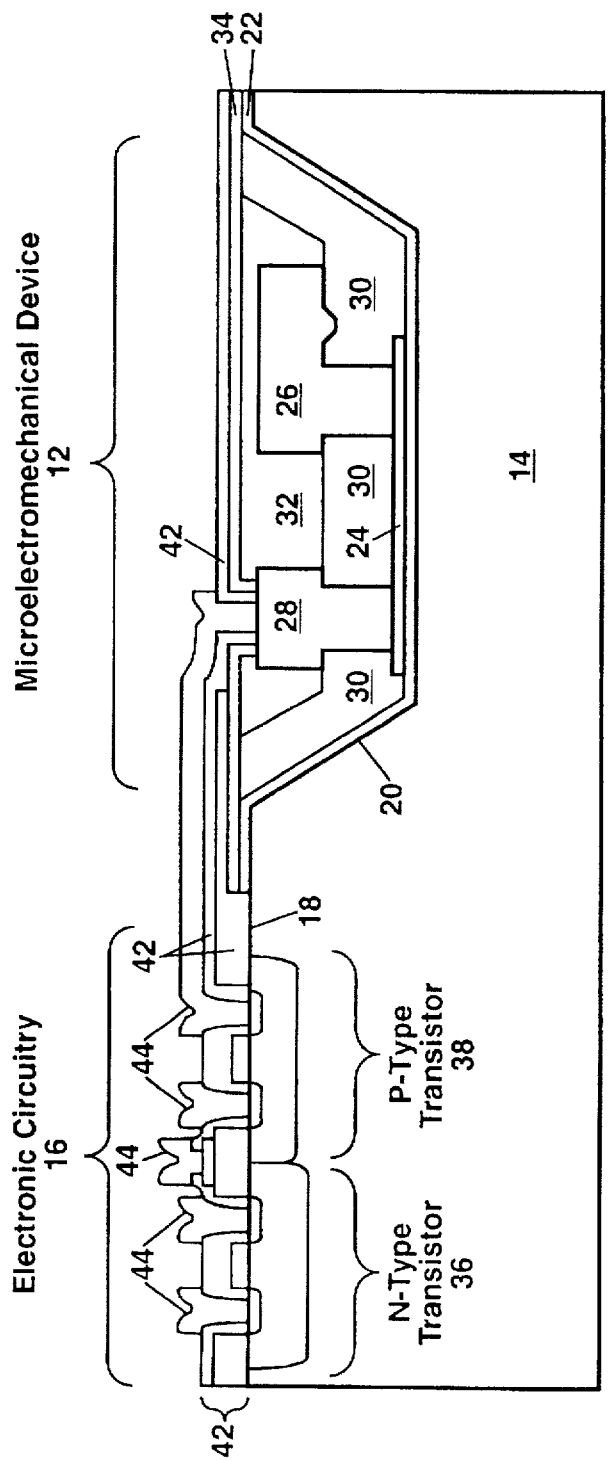

In FIG. 10, one or more layers of an interconnect metallization 44 are provided by standard deposition and patterning steps to interconnect elements (e.g. transistors, resistors, capacitors) forming the electronic circuitry, to provide electrical interconnections to the MEM devices via the polysilicon studs 28, and to provide a plurality of bonding or contact pads (not shown) for providing electrical connections to a packaged integrated device 10. (The interconnect metallization 44 is considered herein to form a part of the electronic circuitry 16.) Aluminum or an alloy thereof is preferred for use as the interconnect metallization 44, although other metals (e.g tungsten, gold, copper, platinum, nickel, palladium), metal alloys (including metal silicides) and even doped polysilicon may be used for the electrical interconnections depending upon operating requirements for the integrated devices 10, and a particular set of standard process steps to be used for practice of the present invention. Additional passivation layers (e.g. about 200 nanometers of a silicate glass such as plasma-enhanced TEOS, also termed PETEOS) not shown in FIG. 10 may be provided to separate a plurality of layers of the interconnect metallization 44, and to blanket the electronic circuitry and interconnect metallization for protection and stress relief.

Figure 11:
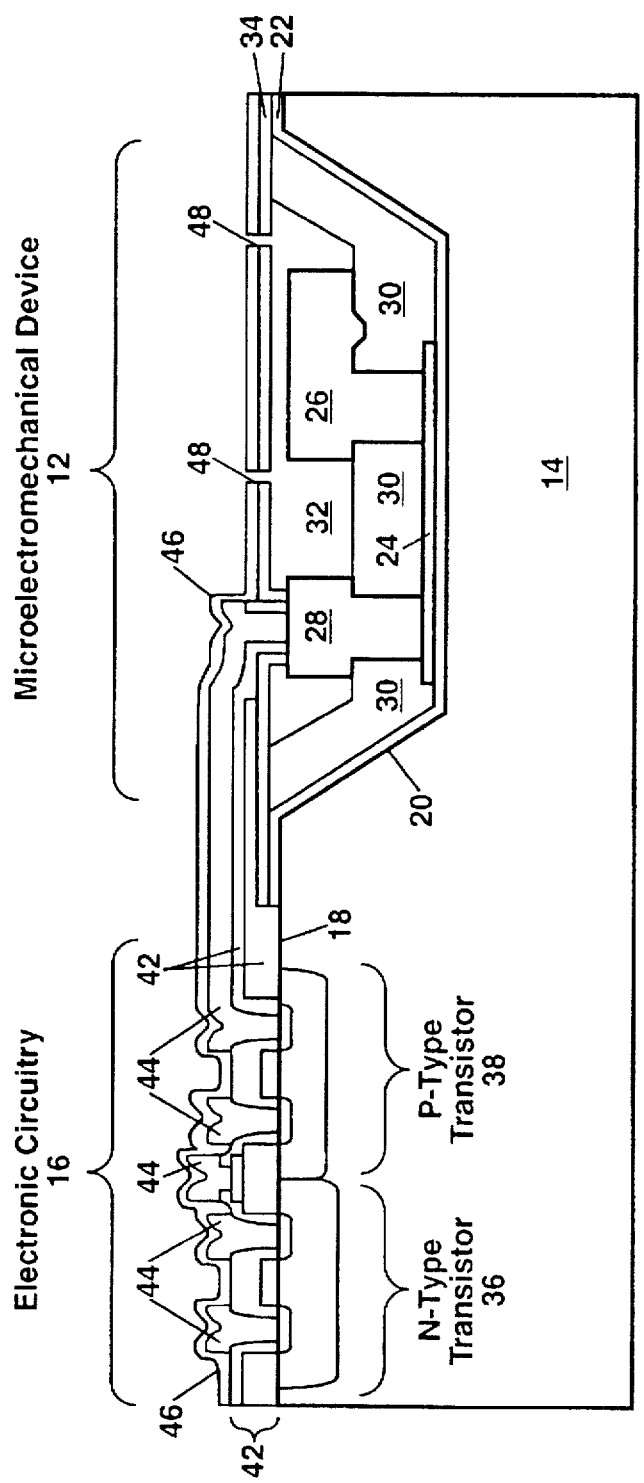

In FIG. 11, after fabrication of the electronic circuitry is substantially completed, a protection layer 46 preferably comprising silicon nitride (e.g PECVD silicon nitride for an aluminum interconnect metallization 44) is deposited to blanket the substrate 14 to protect the electronic circuitry during an etch release process step whereby the MEM devices 12 are exposed to an etchant to remove the sacrificial material and release the MEM devices into their final suspended states for movement or operation. The protection layer 46 may be overcoated with a thin layer (about 100 nanometers thickness) of PECVD oxide to improve adhesion for a photoresist layer formed thereon for opening up one or more etch channels 48 and for covering a plurality of exposed bonding or contact pads. (In other embodiments of the present invention, the protection layer 46 may comprise a layer of hardened resist, polyimide or the like that is chemically resistant to the etchant used for removing the sacrificial layers 30 and 32.)

Figure 12:
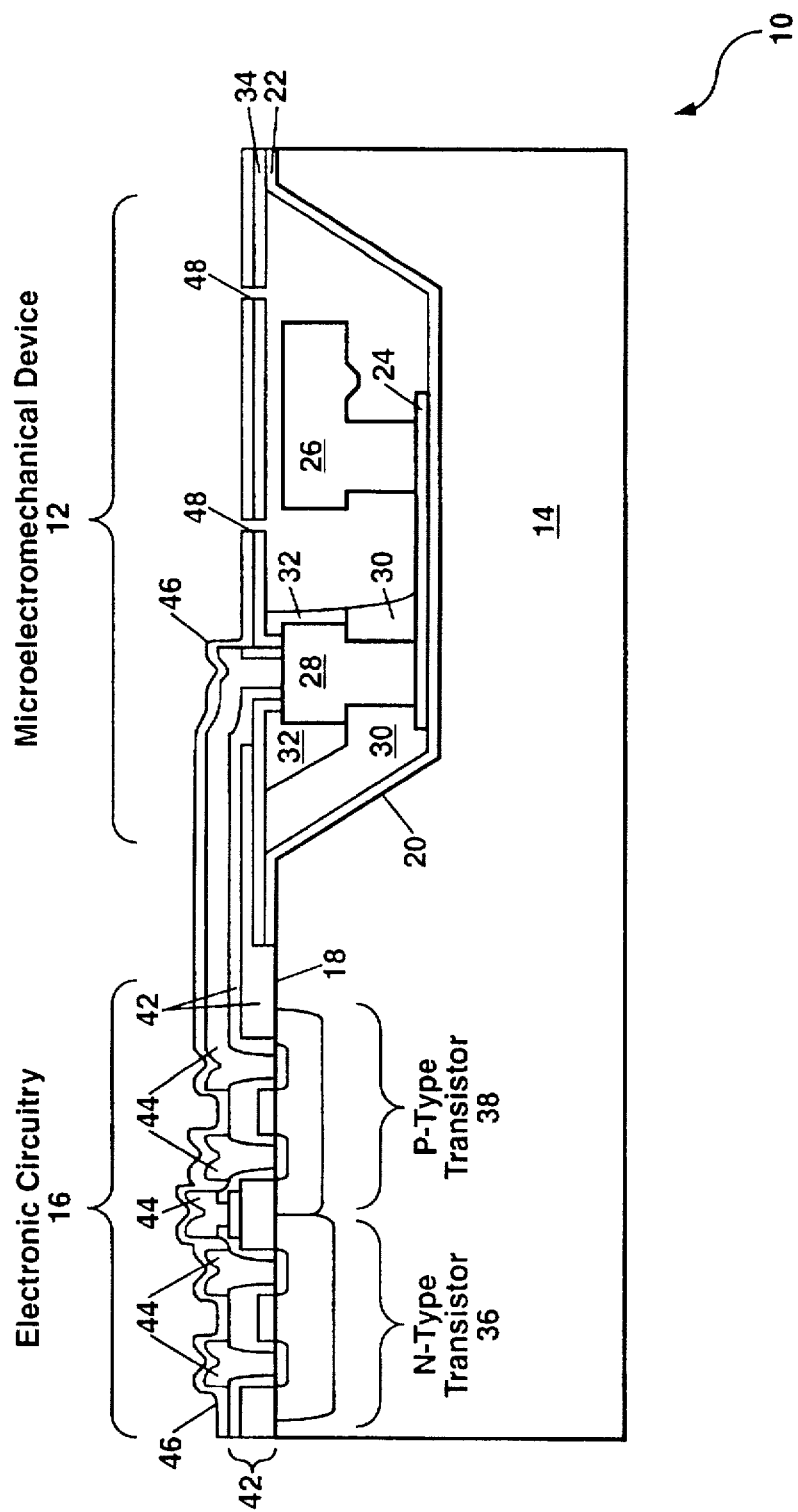

In FIG. 11, one or more etch channels 48 are provided by etching downwards through portions of the protection layer 46 and the underlying cap layer 34. FIG. 12 shows the substrate with integrated MEM devices and electronic circuitry after a wet etching step in which the sacrificial material (e.g. sacrificial layers 30 and 32) is removed at least in part by a chemical etchant (e.g buffered HF). The etchant composition is selected to dissolve the sacrificial material but not to affect other materials (e.g. polysilicon, nitride, metals, resist, polyimide) that may be used for forming the MEM devices and protecting the electronic circuitry. In order to remove all of the sacrificial material, the wet etching process may be of a long time duration (several hours or longer).

Alternately, the wet etching process step may be limited in time duration so that some of the sacrificial material is left to support the polysilicon studs 28 and/or other fixed structural elements of the MEM devices. In this latter case, the positions of the etch channels 48 and the composition of the etchant (and the time for etching) are preferably selected to limit a lateral extent of etching of the sacrificial material, thereby leaving portions of the sacrificial material surrounding the polysilicon studs 28 and/or the other fixed structural elements.

After this etch release step, the substrate is then preferably washed in a rinse fluid for cleansing thereof, and dried preferably using one of the stiction-free drying methods known to the art. Additionally, the released MEM devices may be exposed to a stiction-prevention agent as known to the art for reducing possibility for stiction of moveable elements (e.g. cantilevered beams) of the MEM devices during the drying step and thereafter. After release of the MEM devices, the bonding or contact pads are preferably exposed by etching downward through the protection layer 46, unless an HF-resistant metal such as gold has been used for forming the bonding pads. Alternately, it may be preferable to expose the pads prior to the etch release step and protect the exposed pads with a layer of photoresist. Then, after the etch release step, the photoresist may be removed by a solvent dissolution step to expose the pads.

Figure 13:
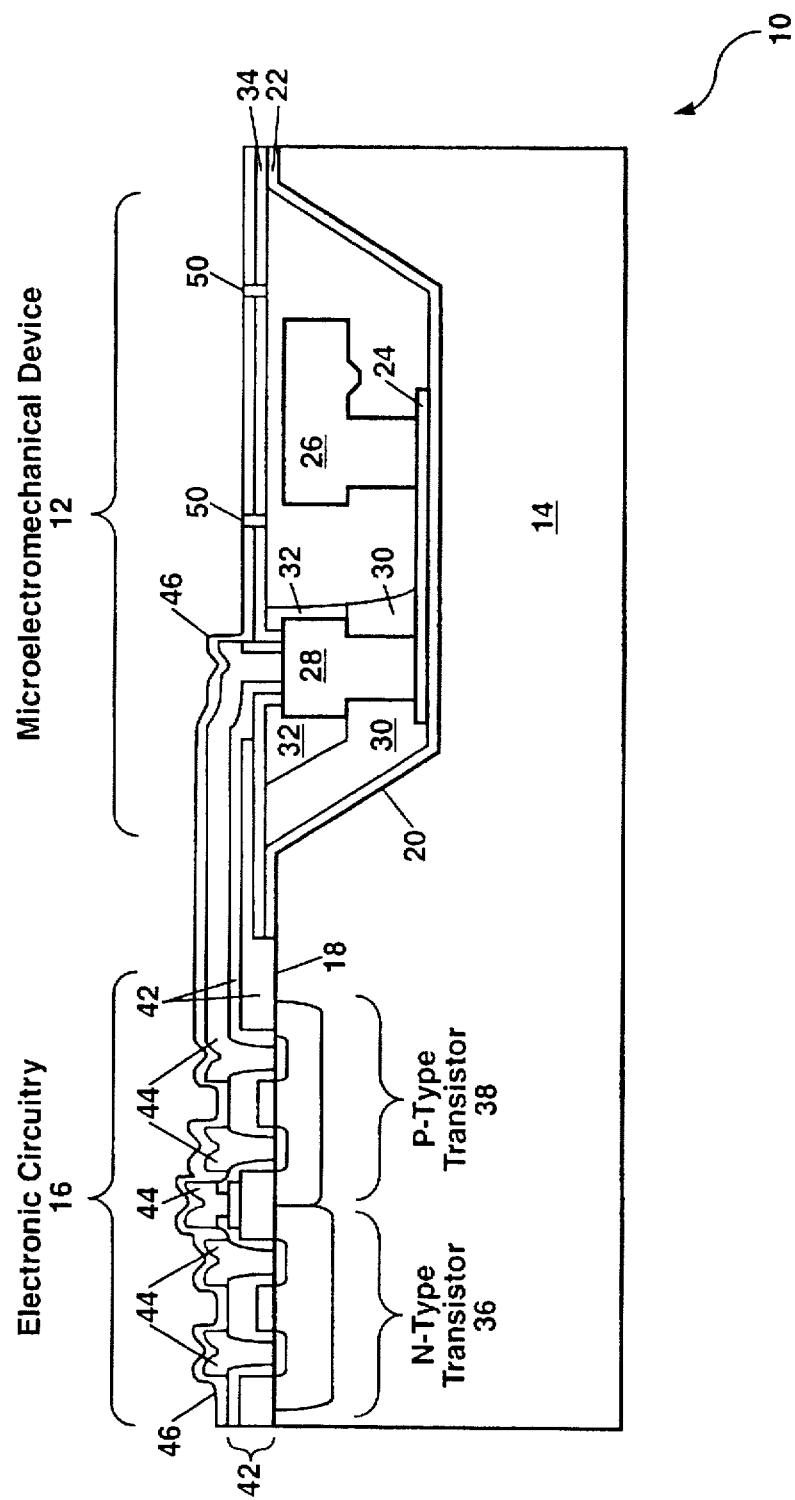

The etch channels 48 in FIGS. 11 and 12 may range in size from about 1–1000 µm diameter depending on the particular type of MEM devices to be formed and also on whether one or more of the etch channels will later be plugged by deposition of silicon nitride for forming a sealed cavity (e.g. for providing a predetermined level of pressure or vacuum therein, or for forming a pressure diaphragm above the cavity for sensing an ambient or applied pressure or vacuum); or for providing a protected enclosure for the MEM devices, thereby simplifying packaging and reducing packaging costs. This process step of plugging one or more of the etch channels according to some embodiments of the present invention is shown in FIG. 13. By plugging the etch channels 48 with plugs 50 of a deposited material such as PECVD nitride, the MEM devices may be sealed under a near-vacuum condition (about 200 Torr pressure).

In some embodiments of the present invention, polysilicon piezoresistors may be formed over a pressure diaphragm formed above the MEM devices by the plugged nitride and protection layers (34 and 46, respectively) for measuring changes in pressure or vacuum. These process steps for sealing the MEM devices 12 may also be advantageous for packaging the integrated device 10 since the sealed MEM devices (with or without plugs 50) are substantially protected from the environment outside the cavity 20, thereby substantially reducing any potential damage due to dust, and also minimizing damage that might otherwise result from handling, testing, or packaging. The completed integrated device 10 with one or more sealed MEM devices may then be packaged by any means known to the art including the use of relatively inexpensive molded packages formed of plastics, epoxy or the like.

The matter set forth in the foregoing description and accompanying drawings is offered by way of illustration only and not as a limitation. Other applications and variations of the method for integrating microelectromechanical devices with electronic circuitry will become evident to those skilled in the art. In some embodiments of the present invention, a portion the protection layer 46 that overlies the electronic circuitry may be removed after the etch release process step, especially when the electronic circuitry has been blanketed with a passivation layer such as PETEOS. In other embodiments of the invention, the protection layer 46 and the second nitride layer 34 may be removed over a preselected portion or the entirety the MEM devices to expose elements (e.g. combustible gas sensing elements, volatile gas sensing elements, chemical sensor elements, moveable optical shutter elements, micromirror elements, or the like) of the MEM devices to the ambient or other environment, or to external applied stimuli. The actual scope of the invention is intended to be defined in the following claims when viewed in their proper perspective based on the prior art.

What is claimed is:

1. A method for integrating at least one microelectromechanical (MEM) device with electronic circuitry on a substrate comprising the steps of:
   (a) etching a cavity within the substrate extending below a device surface of the substrate;
   (b) forming the MEM device within the cavity by depositing a plurality of material layers in the cavity and patterning at least one of the material layers, the MEM device being entirely below the device surface of the substrate;
   (c) encapsulating the MEM device with at least one sacrificial material, and planarizing the substrate;
   (d) fabricating electronic circuitry comprising a plurality of transistors on the device surface of the substrate, including forming electrical interconnections to the encapsulated MEM device; and
   (e) removing the sacrificial material at least in part for releasing the MEM device for operation thereof.

2. The method of claim 1 wherein the substrate includes an epitaxial layer formed thereon to provide the device surface.

3. The method of claim 1 further including a step of depositing a nitride layer over the device surface of the substrate and within the cavity prior to forming the MEM device.

4. The method of claim 1 wherein the step of etching the cavity is performed at least in part by a dry etching method.

5. The method of claim 1 wherein the step of etching the cavity is performed at least in part by a wet etchant.

6. The method of claim 5 wherein the wet etchant is selected from the group consisting of KOH, TMAH, and EDP.

7. The method of claim 1 wherein the step of etching the cavity includes forming sloped sidewalls of the cavity.

8. The method of claim 1 wherein the step of forming the MEM device within the cavity includes depositing, patterning, and etching a plurality of layers of micromachineable materials selected from the group consisting of polysilicon, silicon dioxide, silicon nitride, silicate glass and metals and metal alloys.

9. The method of claim 1 wherein the step of encapsulating the MEM device includes depositing a plurality of layers of the at least one sacrificial material.

10. The method of claim 9 wherein the step of forming the MEM device includes depositing a nitride layer within the cavity and on the device surface of the substrate and the step of encapsulating the MEM device and planarizing the substrate includes removing a portion of the sacrificial material extending above the nitride layer on the device surface of the substrate.

11. The method of claim 10 wherein the step of removing the sacrificial material comprises chemical-mechanical polishing of a top side of the substrate.

12. The method of claim 10 wherein the step of encapsulating the MEM device includes depositing a cap layer above the sacrificial material for sealing the encapsulated MEM device.

13. The method of claim 12 wherein the MEM device is free to respond to stimuli applied thereto while being substantially protected by the overlying cap layer.

14. The method of claim 1 wherein the step of fabricating electronic circuitry comprises forming a plurality of electronic devices selected from the group consisting of CMOS devices, BiCMOS devices, and bipolar devices.

15. The method of claim 1 further including a step of depositing a protection layer over the electronic circuitry for protection thereof during the step of removing the sacrificial material.

16. The method of claim 1 wherein the step of removing the sacrificial material includes exposing at least a portion of the sacrificial material by forming a plurality of etch channels and removing the sacrificial material, at least in part, by etching thereof.

17. The method of claim 16 further including a step of plugging each etch channel after removing at least a part of the sacrificial material.

18. The method of claim 1 further including a step of annealing the encapsulated MEM device for removing stress therein.

19. The method of claim 1 wherein the MEM device comprises at least in part polysilicon.

20. A method for integrating at least one microelectromechanical (MEM) device with electronic circuitry comprising the steps of:

(a) providing a substrate having a cavity extending below a device surface of the substrate;

(b) forming the MEM device within the cavity by depositing a plurality of material layers in the cavity and patterning at least one of the material layers, the MEM device being entirely below the device surface of the substrate;

(c) encapsulating the MEM device with sacrificial material and planarizing the substrate prior to fabricating electronic circuitry comprising a plurality of transistors on the device surface of the substrate, including forming electrical interconnections to the encapsulated MEM device; and (d) removing, at least in part, the sacrificial material and releasing the MEM device for operation thereof after fabricating the electronic circuitry.

21. The method of claim 20 wherein the substrate includes an epitaxial layer formed thereon to provide the device surface.

22. The method of claim 20 wherein the step of forming the MEM device includes depositing, patterning and etching a plurality of layers of micromachineable materials selected from the group consisting of polysilicon, silicon dioxide, silicon nitride, silicate glass and metals.

23. The method of claim 20 wherein the step of encapsulating the MEM device and planarizing the substrate includes removing a portion of the sacrificial material extending above the device surface of the substrate by chemical-mechanical polishing.

24. The method of claim 20 wherein the step of encapsulating the MEM device and planarizing the substrate includes depositing a cap layer above the sacrificial material for sealing the encapsulated MEM device.

25. The method of claim 24 wherein the cap layer forms at least in part an enclosure for packaging the MEM device.

26. The method of claim 20 wherein the step of fabricating electronic circuitry includes forming a plurality of electronic devices selected from the group consisting of CMOS devices, BiCMOS devices, and bipolar devices.

27. The method of claim 20 further including a step of depositing a protection layer over the electronic circuitry for protection thereof during the step of releasing the MEM device.

28. The method of claim 20 wherein the step of removing the sacrificial material and releasing the MEM device includes a step for forming a plurality of etch channels for exposing the sacrificial material, and a step for removing at least a portion of a sacrificial material from the cavity by etching.

29. The method of claim 28 further including a step of plugging each etch channel after removing the sacrificial material from the cavity.

30. A method for integrating at least one microelectromechanical (MEM) device with electronic circuitry on a substrate having an epitaxial layer thereon, comprising the steps of:

(a) etching a cavity below a device surface of the epitaxial layer on the substrate;

(b) forming the MEM device within the cavity by depositing a plurality of material layers in the cavity and patterning at least one of the material layers, with the MEM device being entirely below the device surface of the epitaxial layer;

(c) encapsulating the MEM device with sacrificial material and planarizing the substrate prior to fabricating electronic circuitry comprising a plurality of transistors on the epitaxial layer; and (d) removing, at least in part, the sacrificial material and releasing the MEM device for operation after fabricating the electronic circuitry.

31. The method of claim 30 wherein the step of forming the MEM device comprises depositing, patterning and etching a plurality of layers of micromachineable materials selected from the group consisting of polysilicon, silicon dioxide, silicate glass, metals and metal alloys.

32. The method of claim 30 wherein the step of removing the sacrificial material includes a step for forming a plurality of etch channels for exposing the sacrificial material and a step for removing at least a portion of the sacrificial material by etching.

33. The method of claim 30 wherein the step of fabricating electronic circuitry comprises forming a plurality of electronic devices selected from the group consisting of CMOS devices, BiCMOS devices, and bipolar devices.

34. The method of claim 30 further including a step for annealing the encapsulated MEM device.

* * * * *